United States Patent
Griebenow et al.

(10) Patent No.: US 8,039,342 B2
(45) Date of Patent: Oct. 18, 2011

(54) ENHANCED INTEGRITY OF A HIGH-K METAL GATE ELECTRODE STRUCTURE BY USING A SACRIFICIAL SPACER FOR CAP REMOVAL

(75) Inventors: Uwe Griebenow, Markkleeberg (DE); Jan Hoentschel, Dresden (DE); Thilo Scheiper, Dresden (DE); Andy Wei, Dresden (DE)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 12/907,675

(22) Filed: Oct. 19, 2010

(65) Prior Publication Data

US 2011/0159657 A1    Jun. 30, 2011

(30) Foreign Application Priority Data

Dec. 31, 2009   (DE) .......................... 10 2009 055 438

(51) Int. Cl.
*H01L 29/78* (2006.01)
(52) U.S. Cl. ................. 438/231; 438/305; 257/E29.266
(58) Field of Classification Search .................. 438/231, 438/305; 257/408, E29.266, E21.433
See application file for complete search history.

(56) References Cited

U.S. PATENT DOCUMENTS

| | | | |
|---|---|---|---|
| 6,093,610 A * | 7/2000 | Rodder | 438/289 |
| 6,373,111 B1 * | 4/2002 | Zheng et al. | 257/407 |
| 2007/0034906 A1 * | 2/2007 | Wang et al. | 257/224 |
| 2007/0128786 A1 * | 6/2007 | Cheng et al. | 438/199 |
| 2009/0085123 A1 * | 4/2009 | Sato | 257/369 |
| 2009/0174002 A1 | 7/2009 | Ouyang et al. | |

FOREIGN PATENT DOCUMENTS

DE    10 2008 011 814 A1    9/2009

OTHER PUBLICATIONS

Translation of Official Communication from German Patent Application 10 2009 055 438.6 dated Oct. 27, 2010.

* cited by examiner

*Primary Examiner* — Matthew Smith
*Assistant Examiner* — Daniel Shook
(74) *Attorney, Agent, or Firm* — Williams, Morgan & Amerson, P.C.

(57) ABSTRACT

In a process strategy for forming sophisticated high-k metal gate electrode structures in an early manufacturing phase, the dielectric cap material may be removed on the basis of a protective spacer element, thereby ensuring integrity of a silicon nitride sidewall spacer structure, which may preserve integrity of sensitive gate materials and may also determine the lateral offset of a strain-inducing semiconductor material.

21 Claims, 7 Drawing Sheets

ENHANCED INTEGRITY OF A HIGH-K METAL GATE ELECTRODE STRUCTURE BY USING A SACRIFICIAL SPACER FOR CAP REMOVAL

BACKGROUND OF THE INVENTION

1. Field of the Invention

Generally, the present disclosure relates to the fabrication of highly sophisticated integrated circuits including transistor elements that comprise a high-k metal gate electrode structure formed in an early process stage.

2. Description of the Related Art

The fabrication of advanced integrated circuits, such as CPUs, storage devices, ASICs (application specific integrated circuits) and the like, requires a high number of circuit elements to be formed on a given chip area according to a specified circuit layout, wherein field effect transistors represent one important type of circuit element that substantially determines performance of the integrated circuits. Currently, a plurality of process technologies are practiced, wherein, for many types of complex circuitry, including field effect transistors, MOS technology is one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a planar transistor architecture, the distance between the source and drain regions, which is also referred to as channel length.

Presently, most of the integrated circuits are formed on the basis of silicon due to its substantially unlimited availability, the well-understood characteristics of silicon and related materials and processes and the experience gathered during the past 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes as are required, for example, for anneal cycles to activate dopants and to cure crystal damage without sacrificing the electrical characteristics of the interface.

For the reasons pointed out above, in field effect transistors, silicon dioxide is preferably used as a base material for gate insulation layers that separate the gate electrode, frequently comprised of polysilicon, from the silicon channel region. In steadily improving device performance of field effect transistors, the length of the channel region has been continuously decreased to improve switching speed and drive current capability. Since the transistor performance is controlled by, among other things, the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling, in combination with sophisticated lateral and vertical dopant profiles in the drain and source regions, to avoid the so-called short channel behavior during transistor operation. The short channel behavior may lead to an increased leakage current and to a pronounced dependence of the threshold voltage on the channel length. Aggressively scaled planar transistor devices with a relatively low supply voltage and thus reduced threshold voltage may suffer from an exponential increase of the leakage current due to the required enhanced capacitive coupling of the gate electrode to the channel region since the thickness of the silicon dioxide layer has to be correspondingly reduced to provide the required capacitance between the gate and the channel region. For example, a channel length of approximately 0.08 µm may require a gate dielectric made of silicon dioxide as thin as approximately 1.2 nm. Although usage of high speed transistor elements having an extremely short channel may typically be restricted to high speed applications, whereas transistor elements with a longer channel may be used for less critical signal paths, the relatively high leakage current caused by the direct tunneling of charge carriers through an ultra-thin silicon dioxide gate insulation layer may reach values for an oxide thickness in the range of 1-2 nm that may no longer be compatible with requirements for many types of circuits.

For this reason, new strategies have been developed in overcoming the limitations imposed by high leakage currents of extremely thin silicon oxide-based gate insulation layers. One very promising approach is the replacement of the conventional dielectric materials, at least partially, by dielectric materials having a dielectric constant that is significantly greater than the dielectric constant of silicon dioxide-based materials. For example, dielectric materials, also referred to as high-k dielectric materials, with a dielectric constant of 10.0 and significantly higher may be used, for instance in the form of hafnium oxide, zirconium oxide and the like. In addition to providing a high-k dielectric material in the gate insulation layers, appropriate metal-containing materials may also have to be incorporated since the required work function values for P-channel transistors and N-channel transistors may not be obtained on the basis of standard polysilicon gate materials. To this end, appropriate metal-containing materials may be provided so as to cover the sensitive high-k dielectric materials and act as a source for incorporating an appropriate metal species, such as lanthanum, aluminum and the like, in order to appropriately adjust the work function for N-channel transistors and P-channel transistors, respectively. Furthermore, due to the presence of a metal-containing conductive material, the generation of a depletion zone, as may typically occur in polysilicon-based electrode materials, may be substantially avoided. The process of fabricating a sophisticated gate electrode structure on the basis of a high-k dielectric material may require a moderately complex process sequence since, for instance, the adjustment of an appropriate work function for the transistors of different conductivity type and the fact that high-k dielectric materials may typically be very sensitive when exposed to certain process conditions, such as high temperatures in the presence of oxygen and the like, may require appropriate strategies, for instance with respect to encapsulating the sensitive gate materials. Therefore, different approaches have been developed, such as providing the high-k dielectric material at an early manufacturing stage and processing the semiconductor devices with a high degree of compatibility with standard process techniques, wherein the typical electrode material polysilicon may be replaced in a very advanced manufacturing stage with appropriate metals for adjusting the work function of the different transistors and for providing a highly conductive electrode metal. While this approach may provide superior uniformity of the work function and thus of the threshold voltage of the transistors, since the actual adjustment of the work function may be accomplished after any high temperature processes, a complex process sequence for providing the different work function metals in combination with the electrode metal may be required.

In other very promising approaches, the sophisticated gate electrode structures may be formed in an early manufacturing stage, while the further processing may be based on a plurality of well-established process strategies. In this case, the high-k dielectric material and any metal species for adjusting the work function may be provided prior to or upon patterning the gate electrode stack, which may comprise well-established materials, such as silicon and silicon/germanium, thereby enabling the further processing on the basis of well-established process techniques. On the other hand, the gate electrode stack and in particular the sensitive high-k dielectric materials, in combination with any metal-containing cap layers, may remain reliably confined by appropriate materials throughout the entire processing of the semiconductor device.

Moreover, additional concepts for enhancing performance of transistors have been developed by providing one or more strain-inducing mechanisms in order to increase the charge carrier mobility in the channel regions of the various transistors. It is well known that charge carrier mobility in silicon may be efficiently increased by applying certain strain components, such as tensile and compressive strain for N-channel transistors and P-channel transistors, respectively, so that superior transistor performance may be obtained for an otherwise identical transistor configuration compared to non-strained silicon materials. For instance, efficient strain-inducing mechanisms may be implemented by incorporating a strained semiconductor material in the drain and source regions of transistors, for instance in the form of a silicon/germanium alloy, a silicon/carbon alloy and the like, wherein the lattice mismatch between the semiconductor alloy and the silicon base material may result in a tensile or compressive state, which in turn may induce a desired type of strain in the channel region of the transistor.

Although the approach of providing a sophisticated high-k metal gate electrode structure in an early manufacturing stage, possibly in combination with additional strain-inducing mechanisms, may have the potential of providing extremely powerful semiconductor devices, such as CPUs, storage devices, systems on a chip (SOC) and the like, conventional approaches may still suffer from process non-uniformities, as will be described with reference to FIGS. 1a-1b.

FIG. 1a schematically illustrates a cross-sectional view of a semiconductor device 100 comprising a substrate 101, such as a silicon substrate, and a semiconductor layer 102, such as a silicon layer or a semiconductor material comprising a significant amount of silicon. The semiconductor layer 102 typically comprises isolation structures (not shown), which laterally delineate semiconductor regions or active regions 102A, 102B, which are to be understood as semiconductor regions in the layer 102 in which PN junctions for one or more transistors are to be formed. In the example shown, the active region 102A may correspond to an N-channel transistor 150A. On the other hand, the active region 102B may correspond to a P-channel transistor 150B. Furthermore, as previously discussed, the transistor 150B has implemented therein a strain-inducing mechanism on the basis of a strain-inducing semiconductor material 152, such as a silicon/germanium alloy, which is provided in a strained state and induces a compressive strain component in a channel region 151. Moreover, in the manufacturing stage shown in FIG. 1a, the transistor 150A comprises a gate electrode structure 160A including a gate dielectric material 161A in combination with a metal-containing cap material 162A. As explained above, the gate dielectric material 161A comprises a high-k dielectric material so as to impart an increased permittivity to the gate dielectric material 161A, which may be accomplished, for instance, on the basis of hafnium oxide and the like. It should be appreciated that the gate dielectric material 161A may comprise a dielectric base layer (not shown), such as a silicon dioxide-based material, on which a high-k dielectric material may be formed. Moreover, the gate dielectric material 161A and/or the conductive cap material 162A, which may comprise titanium nitride and the like, have incorporated therein an appropriate metal species, such as lanthanum and the like, in order to adjust an appropriate work function for the gate electrode structure 160A. Similarly, the transistor 150B comprises a gate electrode structure 160B including a gate dielectric material 161B in combination with a conductive cap material 162B. Also, in this case, the dielectric material 161B comprises a high-k dielectric material, while at least one of the layers 161B and 162B contains an appropriate metal species, such as aluminum and the like, in order to provide the desired work function of the gate electrode structure 160B. It should be appreciated that, additionally, the band gap of a portion of the channel region 151 adjacent to the gate dielectric material may have to be adapted with respect to the electronic characteristics of the layers 161B, 162B, which may, for instance, be accomplished by providing an appropriate crystalline channel material (not shown), for instance in the form of a silicon/germanium alloy. Furthermore, the gate electrode structures 160A, 160B comprise a silicon material 163 followed by a dielectric cap material 164, which is substantially comprised of silicon nitride. Additionally, a sidewall spacer structure 165 is provided so as to laterally confine the materials 161A, 162A, 161B, 162B and 163 when forming the strain-inducing semiconductor material 152 and also during the further processing, as otherwise a significant variation of transistor characteristics may be caused upon modifying the materials 161A, 162A, 161B, 162B during the further processing. For example, the spacer structure 165 comprises a silicon nitride liner 165L in combination with a silicon nitride spacer 165S.

The semiconductor device 100 as illustrated in FIG. 1a may be formed on the basis of the following processes. The active regions 102A, 102B may be formed by providing isolation structures on the basis of well-established process strategies, thereby defining the lateral position and size of the active regions 102A, 102B. The basic doping of these regions is then established by using appropriate masking regimes in combination with implantation processes. Next, an appropriate dielectric material, such as silicon oxynitride in combination with a high-k dielectric material, may be deposited by using any appropriate deposition technique, possibly in combination with oxidation processes and the like. Thereafter, any appropriate process sequence may be applied for providing the layers 162A, 162B so as to achieve the desired work function for the gate electrode structures 160A, 160B. For example, appropriate material layers including the metal species may be deposited selectively above the regions 102A and 102B, respectively, and thereafter a diffusion may be initiated so as to drive the work function adjusting species into at least a portion of the previously provided dielectric material, thereby forming the layers 161A, 161B. Thereafter, the diffusion layers may be replaced by any appropriate metal-containing material, such as titanium nitride. In other cases, appropriate metal layer stacks may be formed above the gate dielectric materials so as to achieve the desired electronic characteristics. Next, the silicon material 163 is deposited in combination with the silicon nitride material of the cap layer 164, wherein additional materials may also be provided, such as hard mask materials and the like, as is required for patterning the resulting gate layer stack. After applying complex lithography and etch techniques for patterning the previously formed material layers, a silicon nitride liner material is deposited, for instance, by applying multilayer deposition techniques, which may then be patterned on the basis of plasma assisted etch recipes in order to obtain the liner 165L. Thereafter, a further silicon nitride material is deposited, for instance by low pressure chemical vapor deposition (LPCVD) and may be patterned into the spacer elements 165S. In other cases, the materials for the liner 165L and the spacer 165S may be deposited in subsequent deposition processes and may commonly be patterned. Typically, a width of the spacer structure 165 is selected so as to obtain a desired lateral offset of the strain-inducing semi-conductor material 152, since a reduced lateral offset from the channel region 151 results in an increased strain component, which in turn provides superior transistor performance. For example, a width of the spacer structure 165 may be approximately 10-13 nm, wherein a further reduction of spacer width may not be compatible with the further processing of the semiconductor device 100, in particular with the removal of the dielectric cap layer 164 in a later manufacturing stage.

In some approaches, the corresponding materials of the spacer structures 165 may be selectively patterned into the spacer structure 165 for the transistor 150B, whereas the spacer layer is preserved in the transistor 150A, thereby acting as a growth mask during the further processing. For this purpose, the resist mask may be formed so as to cover the transistor 150A having formed thereon the material layers for the spacer structure 165, while the transistor 150B is exposed to a reactive etch ambient in order to form the spacer structure 165 and further etch into the active region 102B, thereby forming recesses therein. Thereafter, the resist material is removed and the further processing is continued by performing a selective epitaxial growth process in order to deposit the strain-inducing semiconductor material 152, wherein the spacer layer still present above the transistor 150A and the spacer structure 165 in combination with the dielectric cap layer 164 in the gate electrode structure 160B act as an efficient mask material. Thereafter, the spacer layer above the transistor 150A is selectively etched so as to form the spacer structure 165 of the gate electrode structure 160A. In other strategies, a dedicated hard mask material may be provided selectively in the transistor 150A after patterning the spacer structures 165 in both transistors 150A, 150B.

FIG. 1b schematically illustrates the semiconductor device 100 when exposed to an etch process 104 for removing the cap layers 164 from the gate electrode structures 160A, 160B. As previously indicated, since a reduced width of the spacer structure 165 may be considered advantageous in view of reducing the lateral offset of the strain-inducing semi-conductor material 152, a certain probability may exist in unduly removing material of the spacer structure 165, thereby possibly exposing the sensitive materials 161A, 162A, 161B, 162B, which may result in a significant variation of the overall transistor characteristics. A corresponding undue material removal may occur on the basis of well-established wet chemical etch recipes for removing silicon nitride material by using, for instance, hot phosphoric acid. For this reason, plasma assisted etch recipes have been developed so as to reduce the lateral etch rate during the process 104, wherein, however, it has been observed that, for a spacer width of approximately 10-13 nm, nevertheless, significant material erosion in the spacer structure 164 may occur, thereby contributing to unacceptable device variabilities. Consequently, upon further device scaling, which may also require an enhancement of the strain-inducing mechanism, the conventional process strategy may result in significant yield losses.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides manufacturing techniques in which gate electrode structures, such as sophisticated high-k metal gate electrode structures, may be reliably confined by sidewall spacer structures comprised of substantially the same material as a dielectric cap material of the gate electrode structures, wherein the dielectric cap material may be removed by providing an additional spacer element, which may act as an etch mask for protecting the sidewall spacer structure. Consequently, superior integrity of the protective sidewall spacer structure may be achieved, wherein the additional spacer element may be removed at any appropriate manufacturing stage. In some illustrative aspects disclosed herein, the additional spacer element, such as a silicon dioxide spacer and the like, may additionally be used for providing superior flexibility in forming an appropriate dopant profile for the drain and source regions, thereby contributing to superior transistor characteristics.

One illustrative method disclosed herein comprises forming a gate electrode structure of a transistor above a semiconductor region of a semiconductor device, wherein the gate electrode structure comprises a gate insulation layer comprising a high-k gate dielectric material, a metal-containing cap material formed on the gate insulation layer, an electrode material formed above the cap material, a dielectric cap layer formed above the electrode material and a sidewall spacer structure. The method further comprises forming a spacer on the sidewall spacer structure and removing the dielectric cap layer by using the spacer as an etch stop material for protecting the sidewall spacer structure. Additionally, the method comprises forming drain and source regions in the semiconductor region.

A further illustrative method disclosed herein relates to forming a transistor of a semi-conductor device. The method comprises forming a strain-inducing semiconductor alloy in an active region in the presence of a gate electrode structure, which comprises a high-k dielectric material, an electrode material, a dielectric cap layer and a sidewall spacer structure. The method further comprises forming a sacrificial spacer on the sidewall spacer structure and removing the dielectric cap layer selectively to the sacrificial spacer. Additionally, the method comprises removing the sacrificial spacer and forming drain and source regions in the active region.

A still further illustrative method disclosed herein relates to forming a semiconductor device. The method comprises forming a first gate electrode structure above a first active region and a second gate electrode structure above a second active region, wherein the first and the second gate electrode structures comprise a high-k gate dielectric material and a dielectric cap layer. The method further comprises forming a strain-inducing semiconductor material selectively in the first active region. Additionally, the method comprises forming a spacer structure on sidewalls of the first and the second gate electrode structures. Moreover, the method comprises forming a protective spacer on the spacer structures of the first and second gate electrode structures. The method further comprises removing the dielectric cap layer from the first and second gate electrode structures by using the protective spacer as an etch mask. Additionally, drain and source regions are formed in the first and second active regions.

BRIEF DESCRIPTION OF THE DRAWINGS

The disclosure may be understood by reference to the following description taken in conjunction with the accompanying drawings, in which like reference numerals identify like elements, and in which.

Figure 1A:
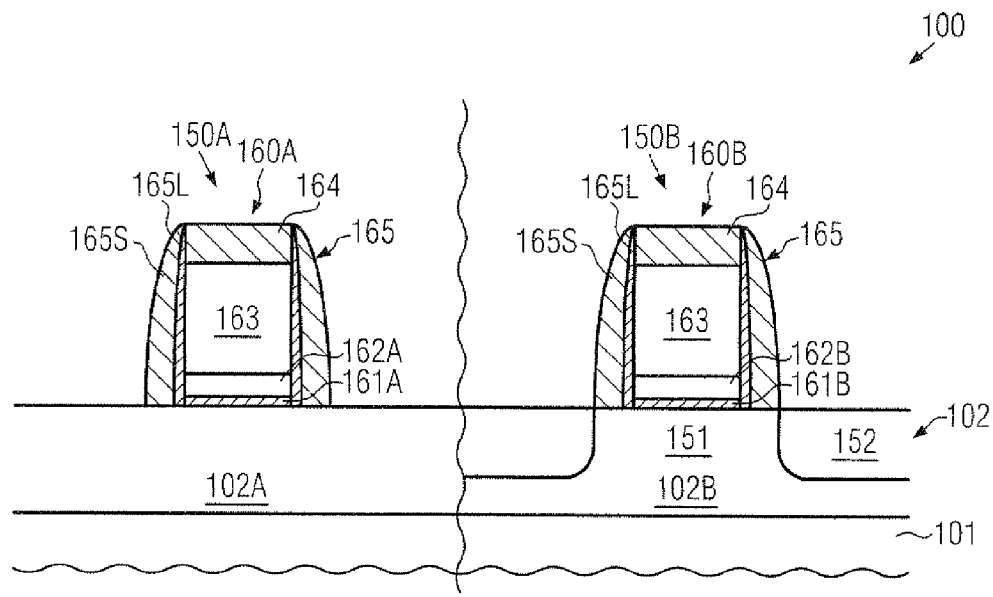
FIGS. 1a-1b schematically illustrate cross-sectional views of a semiconductor device comprising high-k metal gate electrode structures and a strain-inducing semiconductor material, wherein the dielectric cap material of the gate electrode structures is removed on the basis of conventional process strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing techniques in which the dielectric cap material of gate electrode structures including a high-k dielectric material may be removed on the basis of a protective spacer element, which, thus, enables providing a sidewall spacer structure used for preserving integrity of the sensitive gate material that may have a width that is appropriate for reducing a lateral offset of a strain-inducing semiconductor material. Consequently, the dielectric cap material, that is typically provided in the form of a silicon nitride material, may be efficiently removed, for instance on the basis of wet chemical etch recipes, plasma assisted etch processes and the like, without causing undue material erosion of the sidewall spacers, which substantially determines the lateral offset of the strain-inducing material. Consequently, a width of the spacer structure may be selected to be approximately 12 nm and less, without introducing additional process and device irregularities during the further processing. Furthermore, the protective spacer, which in some illustrative embodiments may be removed at any appropriate manufacturing stage, may be used as an additional implantation mask for appropriately generating a desired dopant profile in the drain and source regions. For example, the protective spacer element may be used as an offset spacer for forming drain and source extension regions and halo implantation regions, when the width of the silicon nitride spacer structure used for determining the lateral offset of the strain-inducing semiconductor material is considered as insufficient. In other illustrative embodiments, the drain and source extension regions and the halo regions may be implanted prior to removing the dielectric cap layer and prior to forming the protective spacer element, if an increased overlap of the drain and source regions with the gate electrode structures may be required. For example, an increased Miller capacitance may be superior for high performance transistors and, thus, positioning the entry point with reduced offset for the drain and source extension implantations may provide an increased Miller capacitance. In still other illustrative embodiments, the protective spacer element may be used as an implantation mask for incorporating a "buffer" implantation region, which may thus appropriately connect the shallow drain and source extension regions with deep drain and source areas, which may be formed in a later manufacturing stage.

Consequently, a high degree of flexibility in forming sophisticated drain and source dopant profiles may be achieved on the basis of the protective spacer elements, which in turn preserve integrity of sidewall spacer structure that may be used as an offset spacer for forming the strain-inducing semiconductor material and which may also provide superior integrity of the sensitive gate dielectric materials during the further processing of the semiconductor device.

Figure 1B:
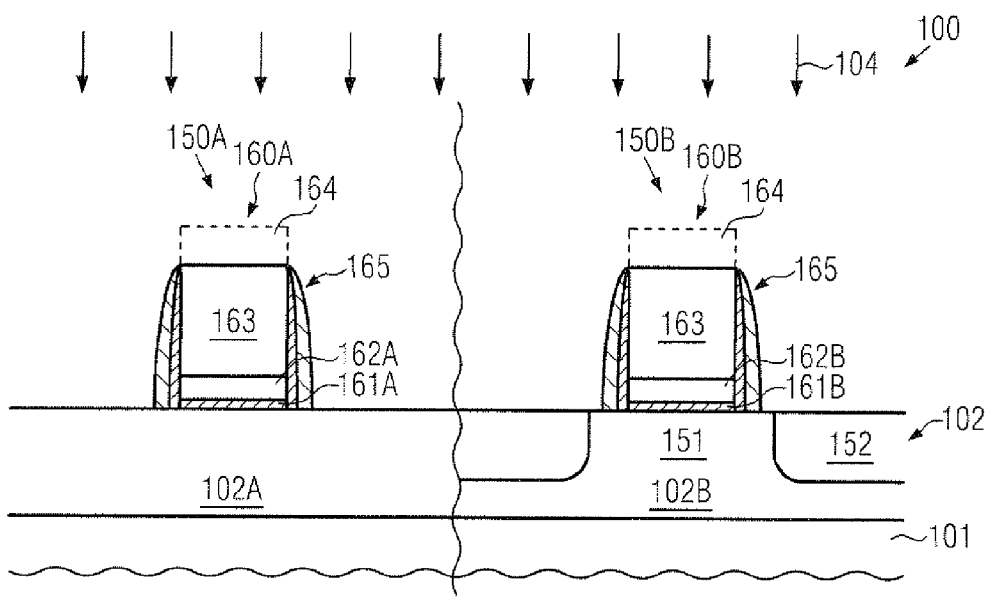

With reference to FIGS. 2a-2k, further illustrative embodiments will now be described in more detail, wherein reference may also be made to FIGS. 1a-1b, if appropriate.

Figure 2A:
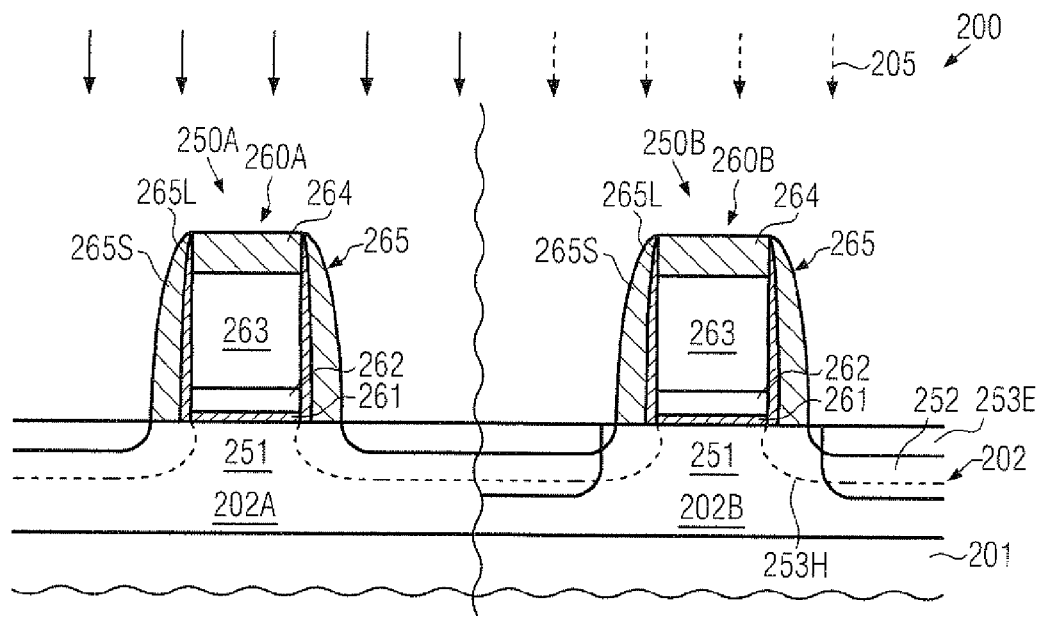
FIGS. 2a-2d schematically illustrate cross-sectional views of a semiconductor device including sophisticated gate electrode structures and a strain-inducing semiconductor material in one type of transistor during various manufacturing stages, in which a dielectric cap material may be removed on the basis of a protective spacer element, according to illustrative embodiments.

FIG. 2a schematically illustrates a cross-sectional view of a semiconductor device 200 comprising a substrate 201, above which may be formed a semiconductor layer 202, such as a silicon-based semiconductor material and the like. Moreover, semiconductor regions or active regions 202A, 202B are formed in the semiconductor layer 202, for instance on the basis of isolation structures (not shown). The active region 202A may correspond to a first transistor 250A, while the active region 202B may correspond to a second transistor 250B, wherein at least one of the transistors 250A, 250B may have implemented therein a strain-inducing mechanism based on a strain-inducing semiconductor material. In the embodiment shown, the transistor 250B may have incorporated in the active region 202B a strain-inducing semiconductor material 252 so as to generate a desired strain component, such as a tensile strain component or a compressive strain component. For example, the transistor 250B may represent a P-channel transistor, so that the material 252 may represent a compressive strain-inducing semiconductor material, such as a silicon/germanium material, when the remaining active region 202B is substantially comprised of a silicon material. On the other hand, the transistor 250A may represent a P-channel transistor which may not require incorporated therein a strain-inducing semiconductor material, while, in other cases, the transistor 250A may represent an N-channel transistor, which may not require incorporation of a tensile strain-inducing semiconductor material. In still other cases, a strain-inducing semiconductor material may also be implemented in the transistor 250A.

Furthermore, the transistor 250A may comprise a gate electrode structure 260A, comprising a gate dielectric material 261, which may have incorporated therein a high-k dielectric material, followed by an electrode material, which may comprise a metal-containing cap material 262 in combination with a semiconductor material 263, such as a silicon material, a silicon/germanium material and the like. Similarly, the transistor 250B may comprise a gate electrode structure 260B comprising the gate dielectric material 261 and metal-containing cap material 262 followed by the semiconductor material 263. It should be appreciated that one or both of the materials 261 and 262 may be different in the transistors 250A 250B, if these transistors represent complementary transistors or transistors that require different threshold voltages and the like. For example, for the materials 261 and 262, the same criteria may apply as previously discussed with reference to the semiconductor device 100. Moreover, the gate electrode structures 260A, 260B may comprise a dielectric cap material 264, such as a silicon nitride material. In the manufacturing stage shown, both gate electrode structures 260A, 260B may comprise a sidewall spacer structure 265 having any appropriate width so as to determine the lateral offset of the strain-inducing material 252 with respect to the electrode material 263 in the transistor 250B. For example, the spacer structure 265 may have any appropriate configuration, for instance comprising a liner material 265L comprised of silicon nitride in combination with a spacer element 265S, which may also be comprised of silicon nitride. The spacer structure 265 may have a width of approximately 12 nm and less, depending on the requirements with respect to the lateral offset of the semiconductor material 252. It should be appreciated that a corresponding material erosion during the further processing upon removing the dielectric cap layers 264 may be less critical compared to conventional strategies, since an additional protective spacer may be provided, as will be explained later on in more detail.

The semiconductor device 200 as illustrated in FIG. 2a may be formed on the basis of the following processes. The gate electrode structures 260A, 260B may be formed by depositing appropriate materials and patterning the same, wherein similar process strategies may be applied as discussed above with reference to the device 100. Thereafter, material layers for the spacer structure 265 may be deposited, for instance based on process techniques as described before, and the material layer(s) may be selectively patterned into the spacer structure 265 of the gate electrode structure 260B, while the spacer materials may be masked above the transistor 250A, for instance on the basis of a resist mask. Next, appropriate cavities may be formed in the active region 202B, wherein the spacer structure 265 may substantially determine, in combination with the etch process parameters, the finally obtained lateral offset of the material 252. Next, the material 252 may be formed on the basis of a selective epitaxial growth process using any appropriate process strategy. During the process, the spacer structure 265 and the cap layer 264 may provide integrity of the material 263 in the gate electrode structure 260B and may, thus, avoid undue material deposition, while the gate electrode structure 260A and the active region 202A may still be covered by the corresponding spacer materials of the components 265L, 265S. Thereafter, the spacer structure 265 may be formed at the gate electrode structure 260A by patterning the corresponding spacer layer, while the transistor 250B may be masked.

In some illustrative embodiments, a process sequence 205 may be performed to introduce dopant species into the active regions 202A, 202B, in order to form drain and source extension regions 253E and counter-doped regions or halo regions 253H, if a corresponding offset of the extension regions 253E determined by the spacer structure 265 is considered appropriate, for instance for providing an increased overlap of the extension regions 253E after performing any final heat treatments in a later manufacturing stage. Consequently, an increased Miller capacitance may be obtained by performing the process sequence 205 on the basis of the sidewall spacer structure 265.

It should be appreciated that the process sequence 205 may include the provision of appropriate implantation masks so as to mask one of the transistors 250A, 250B, while incorporating the dopant species for the drain and source extension regions 253E and the halo region 253H for the other one of the transistors 250A, 250B. Moreover, due to the presence of the dielectric cap layer 264, the gate electrode structures 260A, 260B may have an increased ion blocking effect, which may allow applying increased implantation energy for incorporating the counter-doping species for the halo region 253H without unduly incorporating the dopant species in the sensitive materials 261 and 262 and in particular in channel regions 251. Consequently, the halo regions 253H may extend more deeply into the active regions 202A, 202B compared to conventional strategies, in which a reduced implantation energy is to be applied due to the fact that the dielectric cap material is not present.

In other illustrative embodiments, the process sequence 205 may not be performed in this manufacturing stage, for instance when an increased lateral offset of the drain and source extension regions 253E still to be formed may be considered appropriate.

Figure 2B:
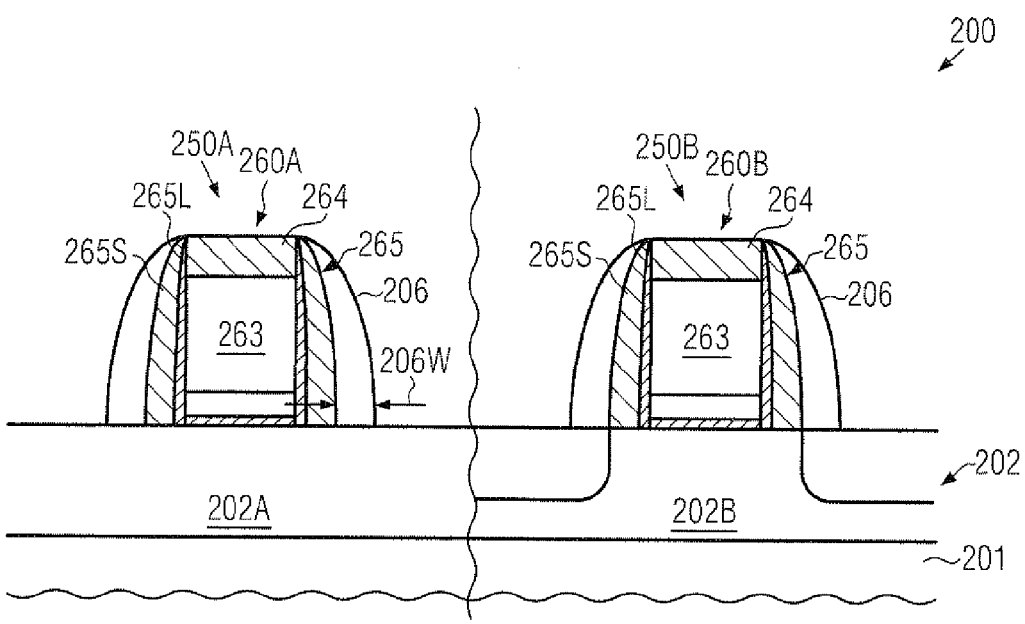

FIG. 2b schematically illustrates the semiconductor device 200 in a further advanced manufacturing stage. As illustrated, a spacer 206 may be formed on the sidewall spacer structure 265 and may be comprised of any appropriate material so as to protect the spacer structure 265 when removing the dielectric cap layer 264 on the basis of any appropriate etch strategy. In one illustrative embodiment, the spacer 206 may be comprised of silicon dioxide material, which may have a high etch resistivity with respect to etch recipes for removing silicon nitride material, for instance by using hot phosphoric acid or plasma assisted etch recipes. A width 206W of the spacer 206 may be adjusted to approximately 6-10 nm, depending on the process strategy. For example, as discussed above, drain and source extension regions and corresponding halo regions may still have to be provided, so that a reduced width 206W may be appropriate in order to subsequently form the drain and source extension regions and using the spacer 206 as an implantation mask. In other cases, as illustrated in FIG. 2a, the extension regions 253E and the halo regions 253H may have been provided on the basis of the spacer structure 265, and the width 206W may be selected with respect to etch resistivity and the like during the subsequent removal of the cap layer 264. In still other illustrative embodiments, as will be described later on in more detail, the width 206W may be selected such that the spacer 206 may act as a further implantation mask for providing a superior overall drain and source dopant profile.

The spacer 206 may be formed by depositing an appropriate spacer layer, such as a silicon dioxide material, and patterning the same on the basis of well-established anisotropic etch techniques.

It should be appreciated that, if desired, superior density of the spacers 206 may be accomplished by performing an anneal process, for instance upon depositing the spacer layer or after patterning the spacer layer into the spacer 206.

Figure 2C:
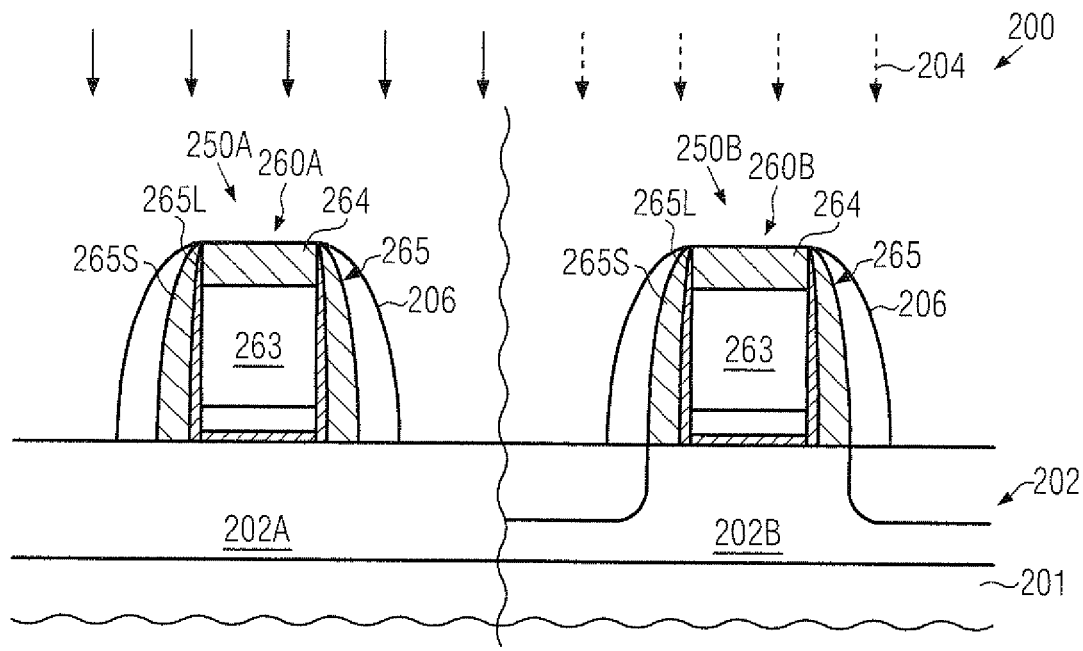

FIG. 2c schematically illustrates the device 200 when exposed to an etch process 204 for removing the cap layers 264 selectively with respect to the protective spacer 206. For this purpose, in some illustrative embodiments, a wet chemical etch recipe, for instance based on hot phosphoric acid, may be applied. In other cases, a plasma assisted removal process may be applied, wherein the etch process may have a high degree of selectivity with respect to silicon dioxide. Moreover, well-established plasma assisted nitride etch chemistries may have a self limiting etch behavior when interacting with silicon material, thereby avoiding undue material loss in the active regions 202A, 202B and in the gate electrode structures 260A, 260B.

In some illustrative embodiments, the spacer 206 may then be removed, which may be accomplished by using selective etch chemistries for removing silicon dioxide material selectively with respect to silicon nitride and silicon. For example, hydrofluoric acid (HF) may be applied, while plasma assisted etch recipes may also be used, depending on the overall process strategy. In other illustrative embodiments, the processing may be continued in the presence of the spacer 206.

Figure 2D:
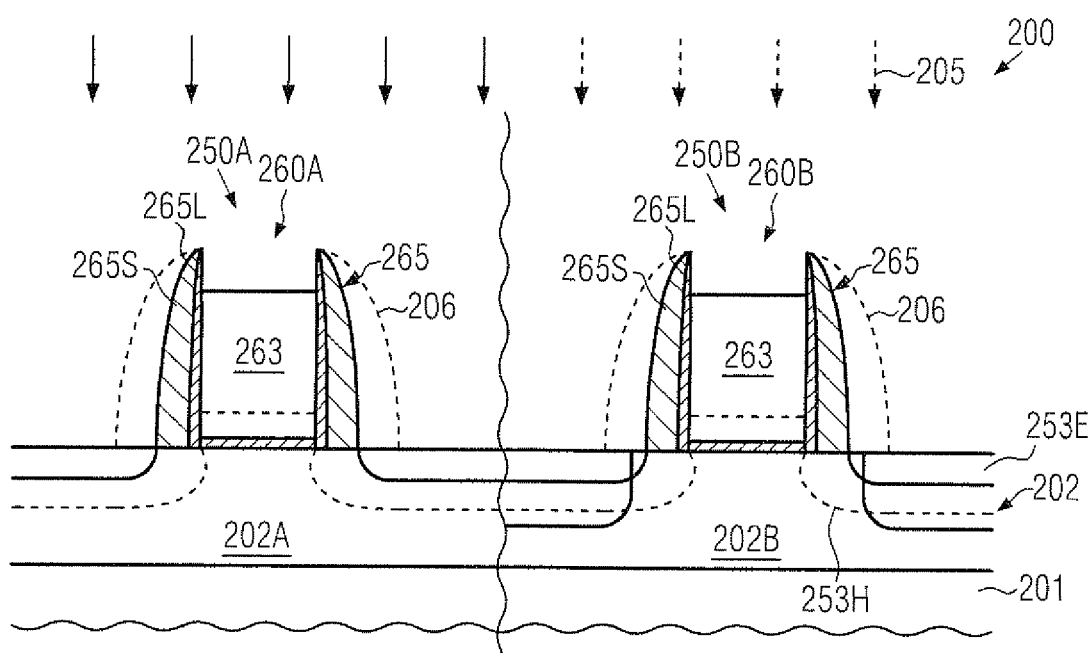

FIG. 2d schematically illustrates the device 200 according to illustrative embodiments in which the drain and source extension regions 253E and the halo regions 253H may be formed on the basis of the process sequence 205 in this manufacturing stage, thereby maintaining a high degree of compatibility with conventional process strategies. Moreover, as indicated by the dashed lines, the spacer 206 may be present during the process sequence 205, if considered appropriate in view of adjusting a desired lateral offset of the extension regions 253E, as is also discussed above. In other illustrative embodiments, the spacer 206 may have been removed prior to the process sequence 205, thereby providing a reduced lateral offset, which may, thus, finally result in an increased Miller capacitance, as is also previously explained.

Figure 2E:
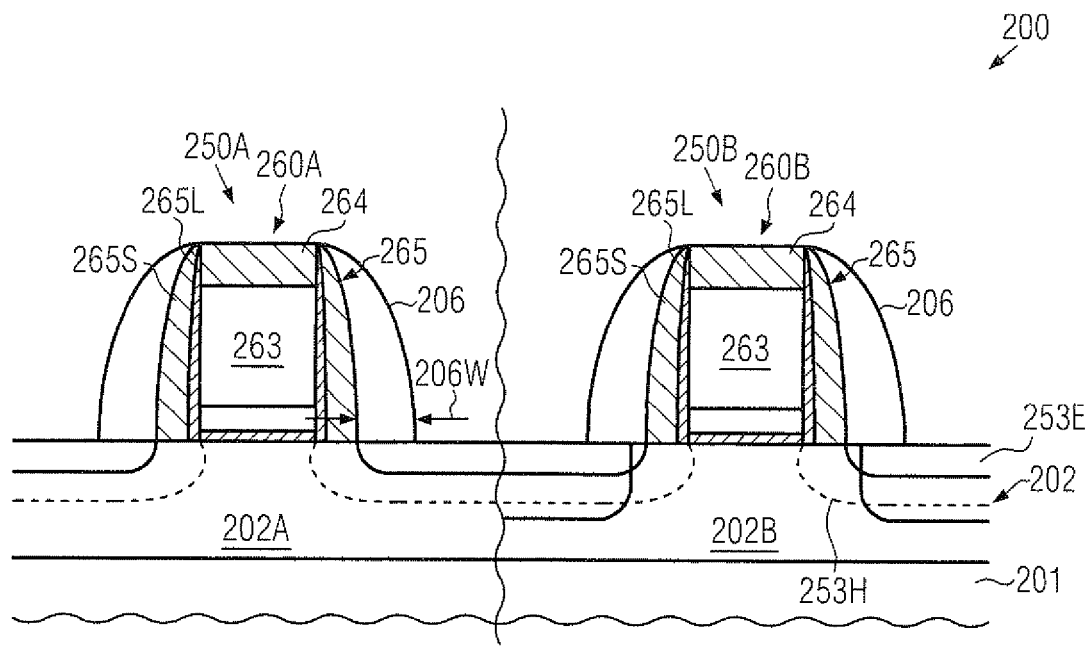
FIGS. 2e-2i schematically illustrate cross-sectional views of the semiconductor device according to still further illustrative embodiments, in which the protective spacer element may additionally be used for providing a superior dopant profile by incorporating a buffer implantation species.

FIG. 2e schematically illustrates the device 200 according to further illustrative embodiments. As illustrated, the drain and source extension regions 253E and the halo regions 253H may have been formed in an early manufacturing stage, as is for instance discussed above with reference to FIG. 2a. Consequently, a desired reduced lateral offset may be obtained for the extension regions 253E, while, at the same time, the halo regions 253H may have been formed on the basis of an increased implantation energy, if desired, due to the increased gate height caused by the presence of the cap layer 264. Furthermore, in the embodiment shown, the spacer 206 is formed on the sidewall spacer structure 265 with a thickness 206W which may be appropriate to act as an implantation mask for incorporating a further drain and source dopant species as well as to provide a superior overall drain and source dopant profile. For example, the width 206W may be selected to be approximately 20-25 nm, depending on the overall lateral dimensions of the transistors 250A, 250B. For example, the above-specified spacer width may be appropriate for gate electrode structures having a gate length of approximately 50 nm and less. It should be appreciated that the gate length is to be considered in FIG. 2e as the horizontal extension of the electrode material 263.

Figure 2F:
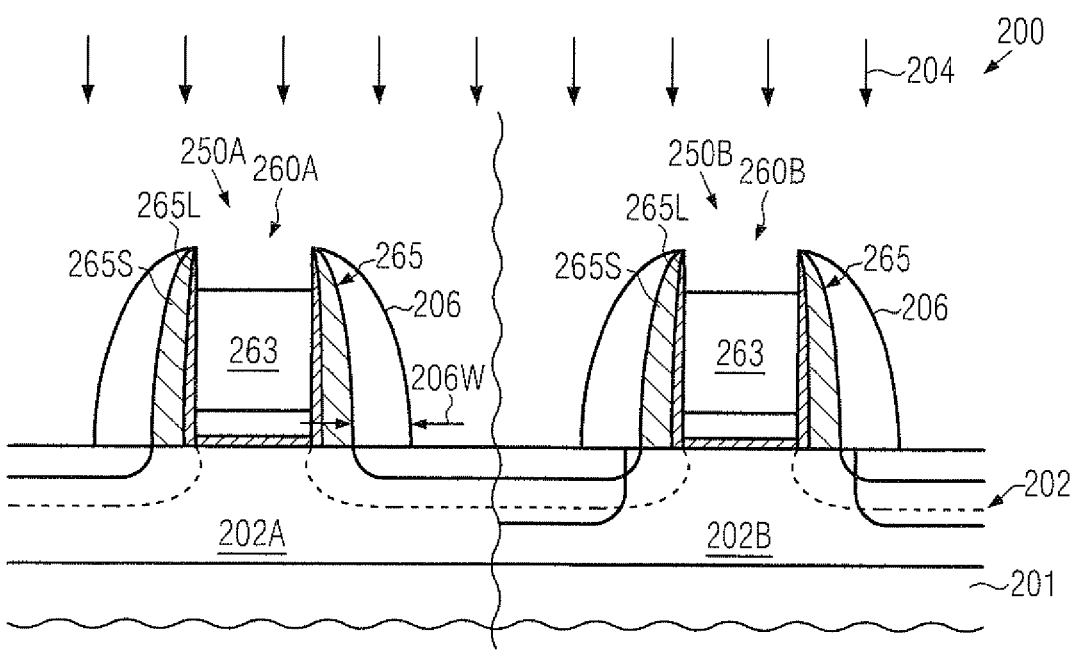

FIG. 2f schematically illustrates the semiconductor device 200 when exposed to the etch process 204 in order to remove the dielectric cap material 264 (FIG. 2e) in the presence of the spacer 206.

Figure 2G:
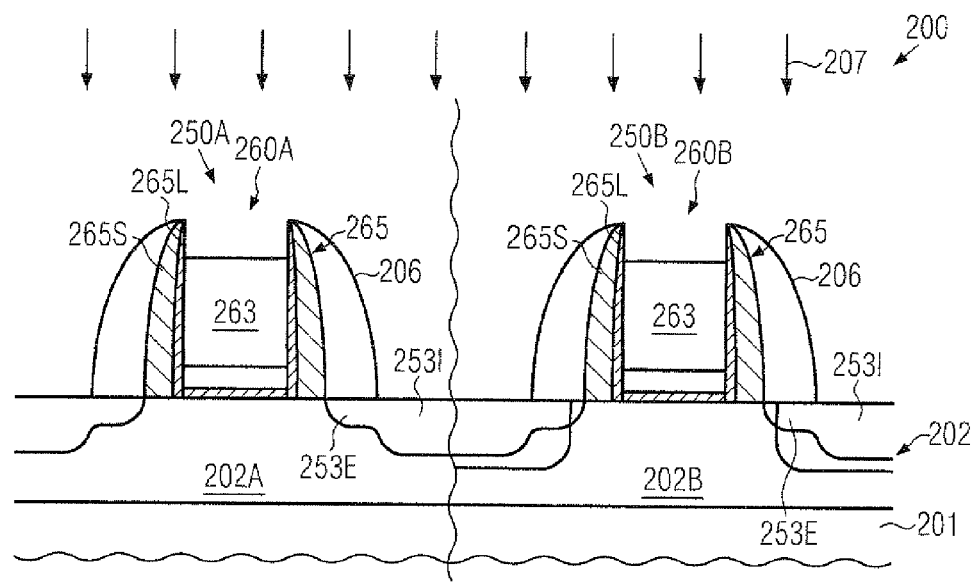

FIG. 2g schematically illustrates the semiconductor device 200 according to illustrative embodiments in which a process sequence 207 may be applied to incorporate a further drain and source dopant species into the active regions 202A, 202B. For this purpose, any appropriate masking regime may be applied in combination with specific implantation processes in order to incorporate a drain and source dopant species with an appropriate dose and energy in order to form intermediate implantation regions or buffer regions 253I, which may thus appropriately connect to the shallow drain and source extension regions 253E and which may, in combination with deep drain and source regions still to be formed, provide an overall superior dopant profile. Thus, during the process sequence 207, the spacer 206 may act as an efficient implantation mask in order to determine the lateral offset of the implantation regions 253I.

Figure 2H:
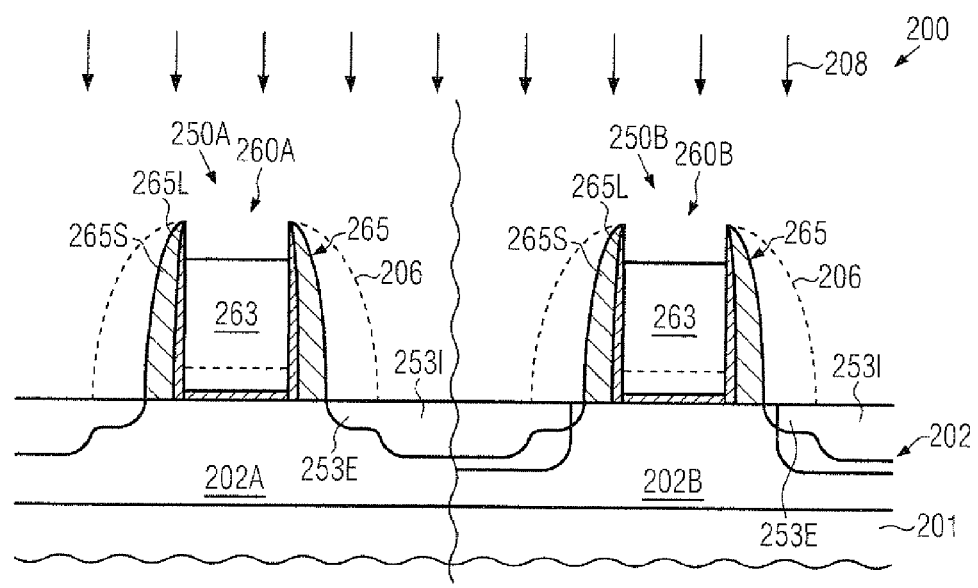

FIG. 2h schematically illustrates the device 200 when exposed to an etch ambient 208 in order to remove the spacer elements 206 in a highly selective manner. For this purpose, hydrofluoric acid (HF) may be efficiently applied, as is also discussed above. On the other hand, the spacer structure 265 may provide the integrity of the sensitive materials in the gate electrode structures 260A, 260B.

Figure 2I:
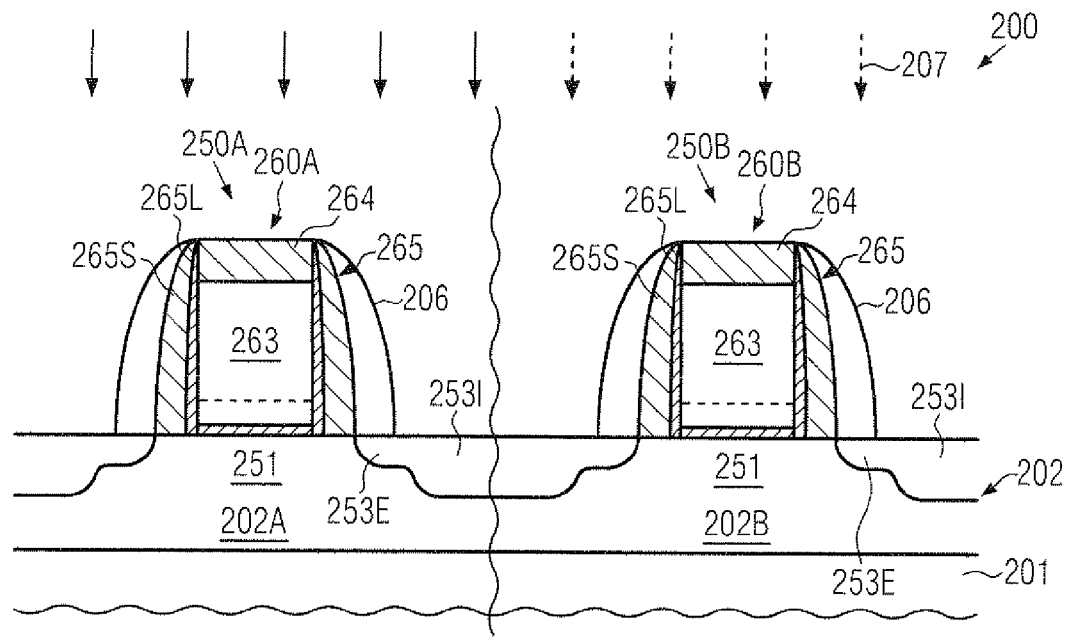

FIG. 2i schematically illustrates the semiconductor device 200 according to illustrative embodiments in which the process sequence 207 may be performed in the presence of the dielectric cap layer 264. That is, the intermediate implantation regions 253I or buffer regions may be formed on the basis of an increased degree of flexibility in selecting appropriate implantation energies for incorporating the drain and source dopant species of the regions 253I, since the cap layer 264 may provide a superior ion blocking effect, thereby reducing the probability of incorporating the dopant species into the channel regions 251, if generally an increased penetration depth for the buffer regions 253I is required. After the process sequence 207, the dielectric cap layers 264 may be efficiently removed, while the spacer 206 may provide integrity of the spacer structure 265, as discussed above. Thereafter, the spacer 206 may be removed, as described before, while, in other cases, the spacer 206 may be preserved during the further processing.

Figure 2J:
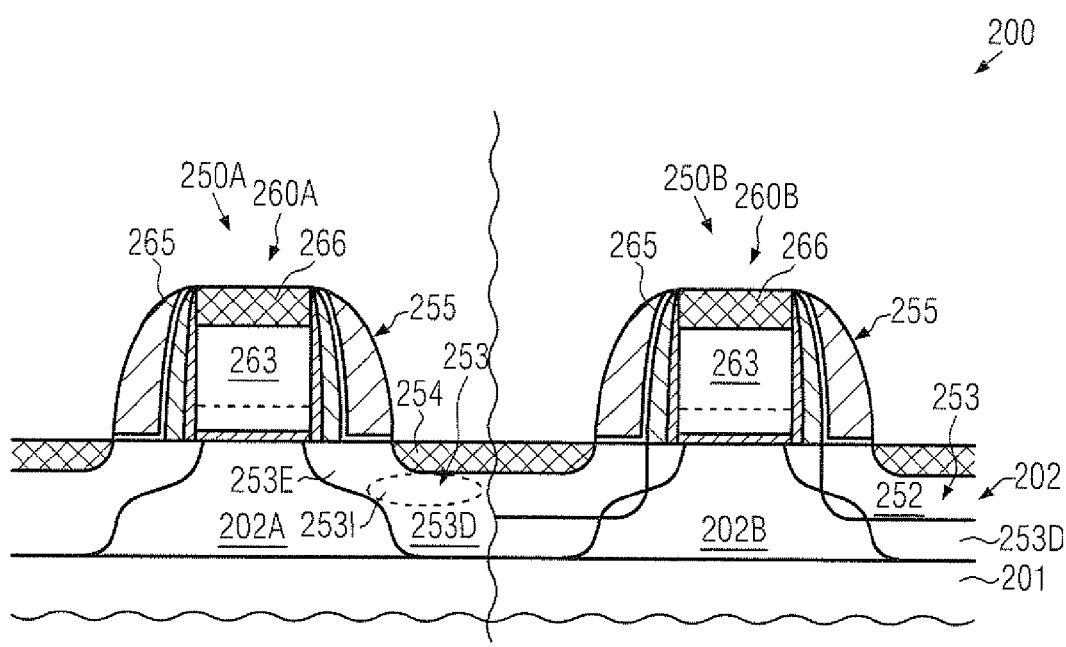
FIGS. 2j-2k schematically illustrate cross-sectional views of the semiconductor device in still further advanced manufacturing stages according to still further illustrative embodiments.

FIG. 2j schematically illustrates the device 200 in a further advanced manufacturing stage. As illustrated, drain and source regions 253 may be formed in the active regions 202A, 202B and may comprise deep drain and source areas 253D, which in combination with the source and drain extension regions 253E may form the drain and source regions 253. In some illustrative embodiments, as described above, the drain and source regions 253 may also include the buffer or intermediate regions 253I, if desired, thereby efficiently connecting the extension regions 253E to the deep drain and source regions 253D. Moreover, metal silicide regions 254 may be formed within the drain and source regions 253. Furthermore, a sidewall spacer structure 255 may be formed on the sidewall spacer structure 265 and may be comprised of any appropriate material, such as silicon nitride, possibly in combination with an etch stop liner and the like. Moreover, a metal silicide 266 may be formed in the semi-conductor material 263 of the gate electrode structures 260A, 260B.

The semiconductor device 200 as shown in FIG. 2j may be formed on the basis of the following processes. After forming the extension regions 253E and, according to some embodiments, forming the intermediate or buffer regions 253I, the spacer 206 (FIG. 2i) may be removed and the spacer structure 255 may be formed in accordance with any appropriate process technique. Thereafter, an implantation process may be performed to incorporate the dopant species for the deep drain and source regions 253D, followed by any appropriate anneal processes in order to activate the dopants and re-crystallize implantation-induced damage. Moreover, a desired degree of dopant diffusion may be initiated during at least one anneal process, thereby obtaining the final dopant profile of the drain and source regions 253, wherein, as previously discussed, any overlap and, thus, Miller capacitance of the drain and source extension regions 253E may be adjusted on the basis of process techniques discussed above. Next, the metal silicide regions 254 and 266 may be formed on the basis of well-established silicidation techniques.

Figure 2K:
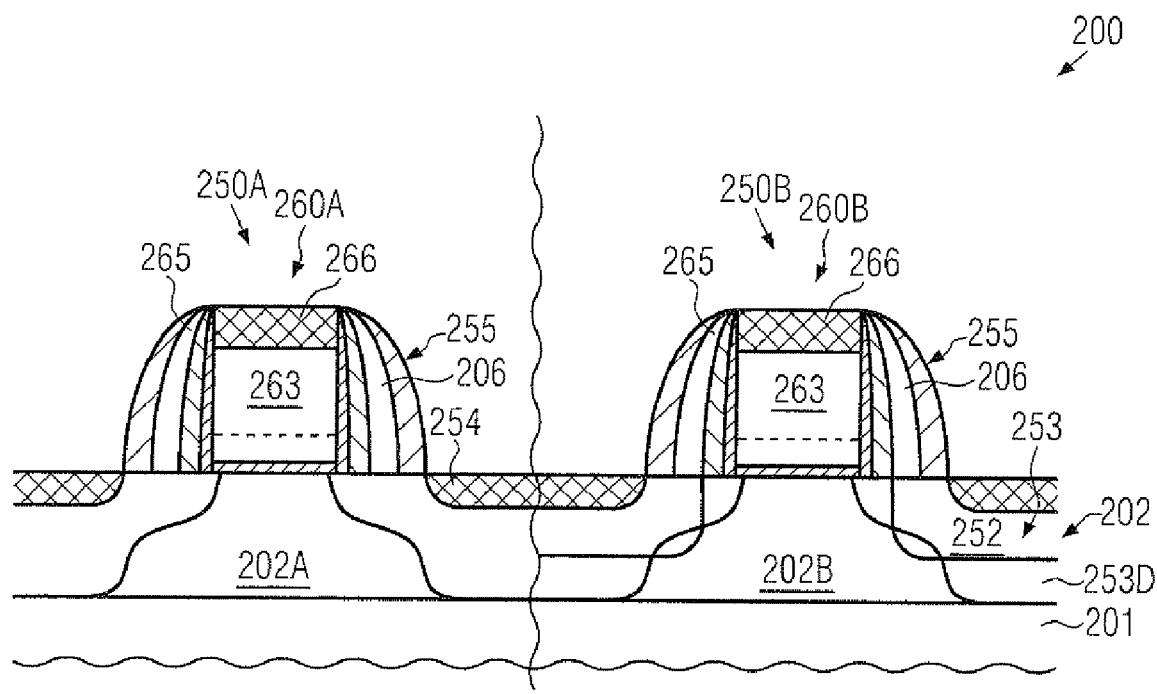

FIG. 2k schematically illustrates the semiconductor device 200 according to still further illustrative embodiments in which the spacer 206 may still be present and spacer structure 255 may be formed on the spacer 206. To this end, any spacer materials for the structure 255 may be deposited with a reduced thickness in order to take into account the width of the spacer 206. Consequently, a reduced overall process complexity may be achieved, since any dedicated processes for removing the spacer 206 may be omitted. Furthermore, the deposition of the spacer material of the structure 255 may be accomplished with a reduced deposition time, thereby also contributing to superior process throughput.

As a result, the present disclosure provides manufacturing techniques in which a protective spacer, such as a silicon dioxide spacer, may be formed on a silicon nitride spacer structure of sophisticated high-k metal gate electrode structures upon removing a dielectric cap material, thereby enabling superior integrity of the sidewall spacer structure, even if provided with a reduced width in order to reduce the lateral offset of a strain-inducing semi-conductor material. Moreover, the protective spacer may be used for generating superior dopant profiles of the drain and source regions, for instance by providing a buffer region so as to appropriately connect drain and source extension regions with deep drain and source areas.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a gate electrode structure of a transistor above a semiconductor region of a semiconductor device, said gate electrode structure comprising a gate insulation layer comprising a high-k gate dielectric material, a metal-containing cap material formed on said gate insulation layer, an electrode material formed above said cap material, a dielectric cap layer formed above said electrode material and a sidewall spacer structure;
forming a spacer on said sidewall spacer structure;
removing said dielectric cap layer by using said spacer as an etch stop material for protecting said sidewall spacer structure; and
forming drain and source regions in said semiconductor region.

2. The method of claim 1, wherein forming said drain and source regions comprises forming drain and source extension regions in the presence of said sidewall spacer structure after removing said dielectric cap layer.

3. The method of claim 2, further comprising removing said spacer selectively to said sidewall spacer structure prior to forming said drain and source extension regions.

4. The method of claim 2, wherein forming said drain and source regions comprises forming drain and source extension regions by using said spacer as an implantation mask.

5. The method of claim 1, wherein forming said drain and source regions comprises forming drain and source extension regions prior to removing said dielectric cap layer.

6. The method of claim 5, wherein said drain and source extension regions are formed prior to forming said spacer.

7. The method of claim 6, further comprising forming at least one further portion of said drain and source regions by using said spacer as an implantation mask.

8. The method of claim 7, wherein forming said at least one further portion of the drain and source region comprises forming deep drain and source regions.

9. The method of claim 7, wherein forming said at least one further portion of the drain and source regions comprises performing a buffer implantation so as to connect said drain and source extension regions and deep drain and source regions.

10. The method of claim 7, further comprising removing said spacer selectively to said sidewall spacer structure and forming a second sidewall spacer structure and using said second sidewall spacer structure as an implantation mask for forming deep drain and source regions.

11. The method of claim 1, further comprising forming cavities in said semiconductor region after forming said gate electrode structure and filling said cavities with a strain-inducing semiconductor material.

12. The method of claim 11, wherein said cavities are formed in said semiconductor region prior to forming said spacer on said sidewall spacer structure.

13. A method of forming a transistor of a semiconductor device, the method comprising:
  forming a strain-inducing semiconductor alloy in an active region in the presence of a gate electrode structure, said gate electrode structure comprising a high-k dielectric material, an electrode material, a dielectric cap layer and a sidewall spacer structure;
  after forming said strain-inducing semiconductor alloy, forming a sacrificial spacer on said sidewall spacer structure;
  removing said dielectric cap layer selectively to said sacrificial spacer;
  removing said sacrificial spacer; and
  forming drain and source regions in said active region.

14. The method of claim 13, wherein forming said drain and source regions comprises forming drain and source extension regions prior to removing said dielectric cap layer.

15. The method of claim 13, wherein forming said drain and source regions comprises performing at least one further implantation process in the presence of said sacrificial spacer.

16. The method of claim 15, wherein forming said drain and source regions further comprises removing said sacrificial spacer after performing said at least one further implantation process, forming a second sidewall spacer structure and using said second sidewall spacer structure as an implantation mask for forming deep drain and source regions.

17. The method of claim 13, wherein forming said drain and source regions comprises forming drain and source extension regions after removing said dielectric cap layer.

18. A method of forming a semiconductor device, the method comprising:
  forming a first gate electrode structure above a first active region and a second gate electrode structure above a second active region, said first and second gate electrode structures comprising a high-k gate dielectric material and a dielectric cap layer;
  forming a strain-inducing semiconductor material selectively in said first active region;
  forming a spacer structure on sidewalls of said first and second gate electrode structures;
  after forming said strain-inducing semiconductor material, forming a protective spacer on said spacer structures of said first and second gate electrode structures;
  removing said dielectric cap layer from said first and second gate electrode structures by using said protective spacer as an etch mask; and
  forming drain and source regions in said first and second active regions.

19. The method of claim 18, wherein forming said drain and source regions comprises forming at least a portion of said drain and source regions by using said protective spacer as an implantation mask.

20. The method of claim 18, wherein forming said drain and source regions comprises forming drain and source extension regions in the presence of said dielectric cap layers.

21. The method of claim 18, wherein forming said drain and source regions comprises forming a further sidewall spacer structure on said protective spacer and forming deep drain and source regions on the basis of said further sidewall spacer structure.

* * * * *